United States Patent
Standing et al.

(10) Patent No.: US 9,070,642 B2
(45) Date of Patent: Jun. 30, 2015

(54) ELECTRONIC MODULE

(75) Inventors: Martin Standing, Villach (AT); Johannes Schoiswohl, San Jose, CA (US)

(73) Assignee: Infineon Technologies AG, Neubiberg (DE)

(*) Notice: Subject to any disclaimer, the term of this patent is extended or adjusted under 35 U.S.C. 154(b) by 918 days.

(21) Appl. No.: 13/232,803

(22) Filed: Sep. 14, 2011

(65) Prior Publication Data

US 2013/0062706 A1    Mar. 14, 2013

(51) Int. Cl.
*H01L 23/34* (2006.01)
*H01L 23/32* (2006.01)
*H01L 23/64* (2006.01)
*H01L 25/16* (2006.01)

(52) U.S. Cl.
CPC ............... *H01L 23/32* (2013.01); *H01L 23/64* (2013.01); *H01L 25/16* (2013.01); *H01L 2924/19103* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 6,301,114 | B1* | 10/2001 | Ootani | 361/704 |
| 6,853,068 | B1* | 2/2005 | Djekic | 257/706 |
| 7,268,426 | B2* | 9/2007 | Warner et al. | 257/707 |
| 2002/0164892 | A1 | 11/2002 | Girbachi et al. | |
| 2003/0057446 | A1* | 3/2003 | Auburger et al. | 257/200 |
| 2005/0264389 | A1 | 12/2005 | Gallup et al. | |
| 2008/0054298 | A1 | 3/2008 | Stevanovic et al. | |

OTHER PUBLICATIONS

Ferreira, J.A., Prof. dr., "SMT High Power Density Drive," pp. 1-3, Delft University of Technology, The Netherlands.

* cited by examiner

*Primary Examiner* — Kyoung Lee
(74) *Attorney, Agent, or Firm* — Slater & Matsil, L.L.P.

(57) ABSTRACT

An electronic module includes a first semiconductor chip and a passive component, wherein the first semiconductor chip is arranged on a surface of the passive component.

24 Claims, 4 Drawing Sheets

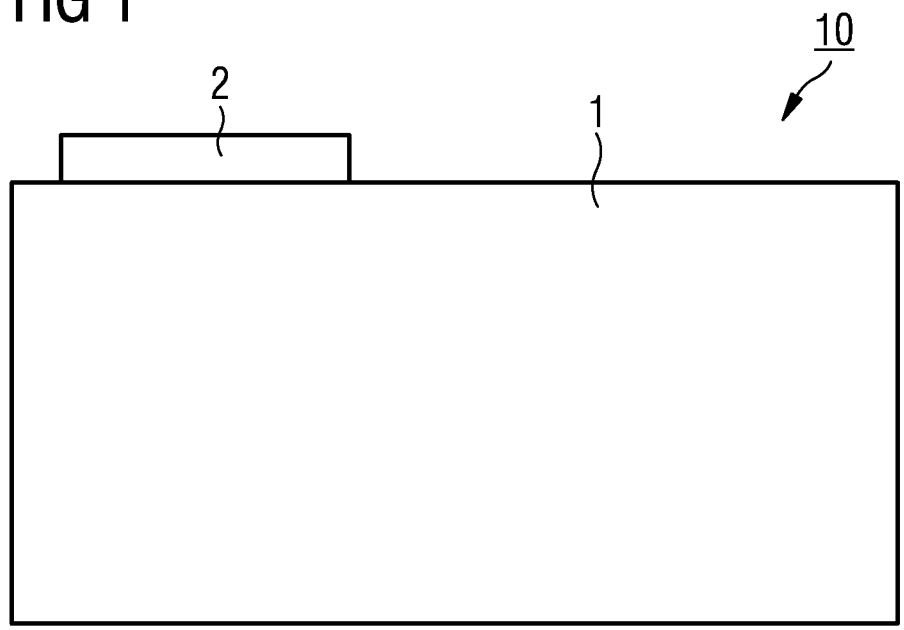
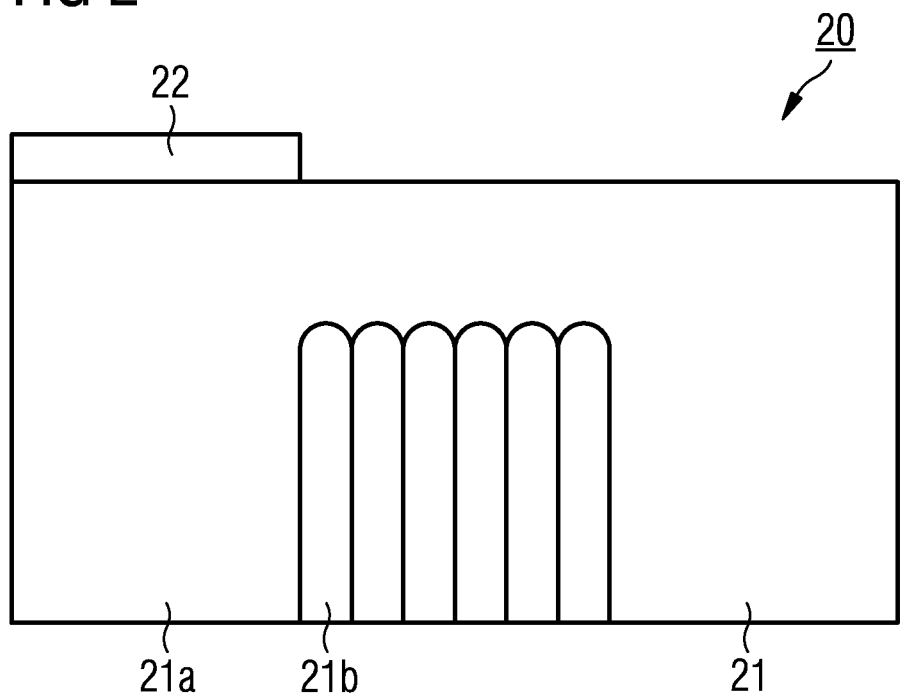

FIG 5
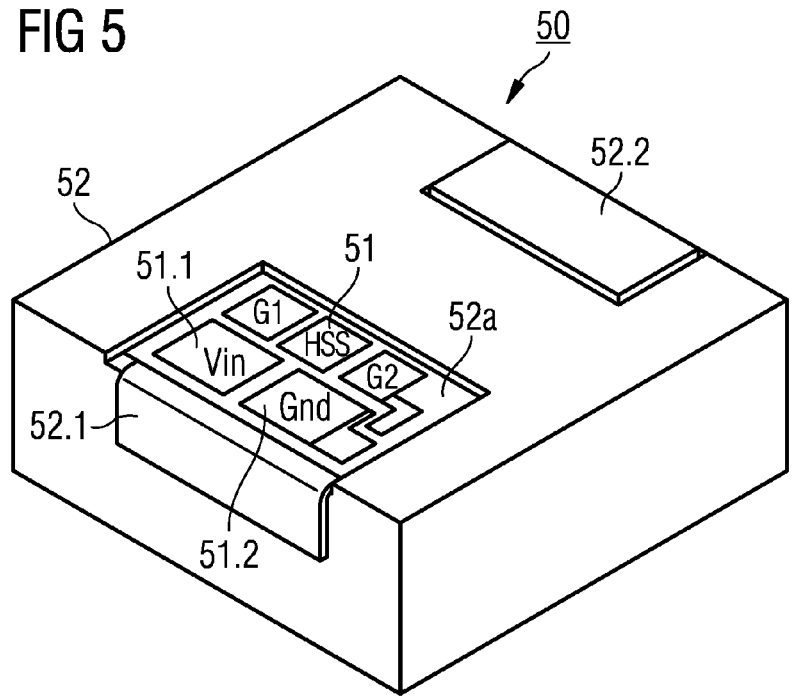
FIG 6
a)
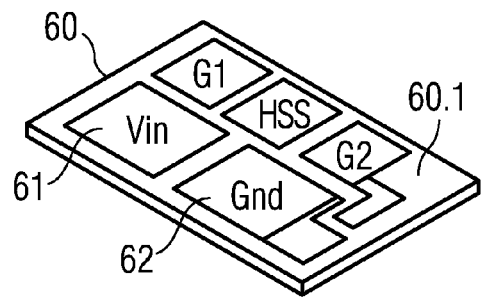
b)
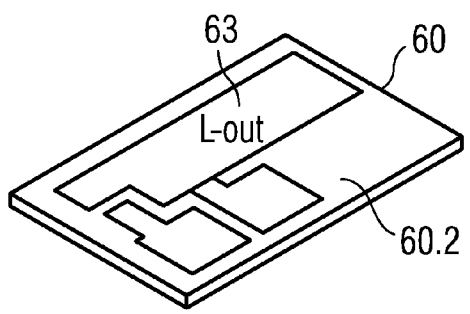

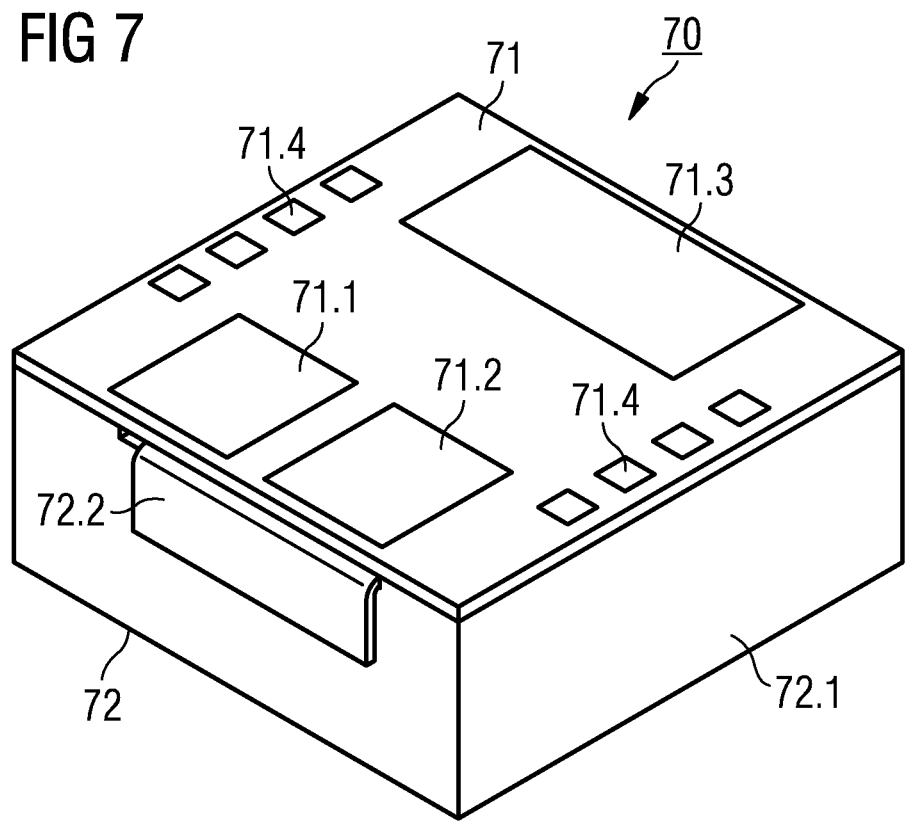

ELECTRONIC MODULE

TECHNICAL FIELD

The present invention relates to an electronic module and a power supply module.

BACKGROUND

The power supply and voltage regulation for devices such as the central processing unit, the memory or peripheral loads becomes a major challenge due to increasing power demands in computing platforms. Higher currents have to be delivered on ever decreasing available board space for the voltage regulator that results in the necessity for higher power density solutions for the voltage regulator. The active and passive components of a power supply or voltage regulator occupy board space and hinder highest-power density solutions. Integrating these active and passive components into one package and simultaneously providing high currents and at the same time meeting efficiency targets and keeping thermal stress low is the major challenge to overcome.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 shows a schematic cross-sectional side view representation of an electronic module according to an embodiment;

FIG. 2 shows a schematic cross-sectional side view representation of a power supply module according to an embodiment;

FIG. 5 shows a perspective representation of a power supply module according to an embodiment;

FIGS. 6a and 6b show perspective top and bottom views of a substrate carrying the semiconductor chips according to an embodiment; and FIG. 7 shows a perspective view of a power supply module according to an embodiment.

DETAILED DESCRIPTION OF ILLUSTRATIVE EMBODIMENTS

Figure 3:
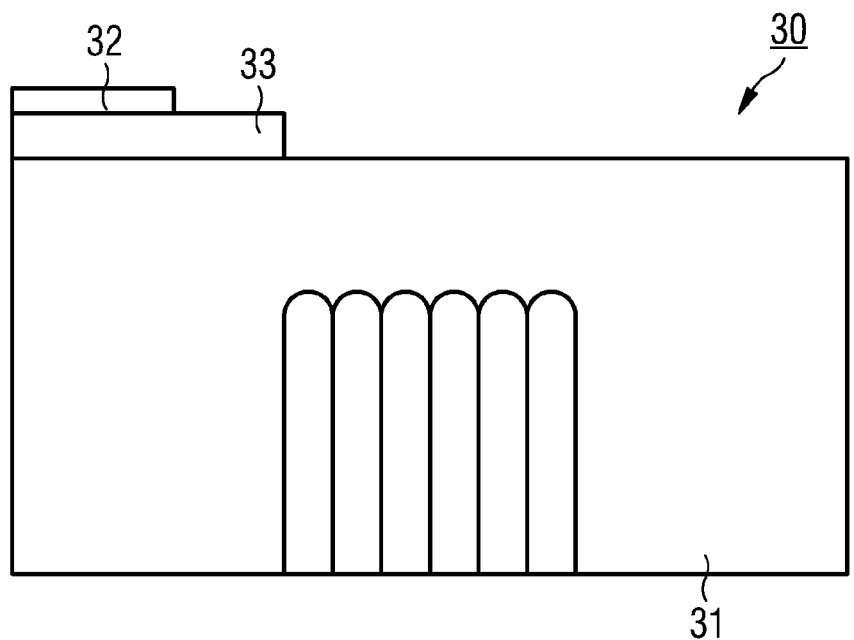
FIG. 3 shows a schematic cross-sectional side view representation of a power supply module according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic module and a power supply module may use various types of semiconductor chips or circuits incorporated in the semiconductor chips, among them driver circuits, logic integrated circuits, analog integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

Referring to FIG. 1, there is shown a schematic cross-sectional side view representation of an electronic module according to an embodiment. The electronic module 10 comprises a first semiconductor chip 2 and a passive component 1, wherein the first semiconductor chip 2 is arranged on a surface of the passive component 1.

According to an embodiment of the electronic module 10, the first semiconductor chip 2 is arranged on or above one of the major surfaces of the passive component 1.

According to an embodiment of the electronic module 10, the first semiconductor chip 2 comprises smaller spatial dimensions than the passive component 1, in particular a major surface of the first semiconductor chip 2 is smaller in spatial dimensions than a major surface of the passive component 1 and the first semiconductor chip 2 is attached with one of its major surfaces on or above a major surface of the passive component 1.

According to an embodiment of the electronic module 10, the first semiconductor chip 2 is connected mechanically and electrically to the passive component 1, in particular the first semiconductor chip 2 is directly connected with one of its surfaces to one of the surfaces of the passive component 1.

According to an embodiment of the electronic module 10, the electronic module 10 further comprises an electronic circuit, wherein the first semiconductor chip 2 and the passive component 1 are both part of the electronic circuit.

According to an embodiment of the electronic module 10, the passive component 1 comprises one or more of an inductor, a capacitor, a transformer, a heat sink, or a chassis component or enclosure component.

According to an embodiment of the electronic module 10, the passive component 1 comprises at least one electrical terminal on one of the surfaces thereof, in particular on one of the major surfaces thereof, wherein the first semiconductor chip 2 is arranged on or above the at least one electrical terminal. According to a further embodiment thereof, a contact pad of the first semiconductor chip 2 is directly electrically and mechanically connected with the at least one electrical terminal of the passive component 1. According to a further embodiment thereof, the first semiconductor chip 2 is situated, at least in part, directly above the electrical terminal of the passive component 1, in particular such part of the first semiconductor chip 2, which comprises the contact pad, is situated directly above the electrical terminal of the passive component 1.

According to an embodiment of the electronic module 10, the electronic module 10 further comprises a substrate, the first semiconductor chip 2 being arranged on the substrate and the substrate being arranged on or above the surface of the passive component 1.

According to a further embodiment thereof, the substrate comprises a plate-like rectangular shape comprising two main opposing surfaces. According to an embodiment thereof, the substrate comprises a first surface and a second surface and a plurality of through-holes extending from the first surface to the second surface.

According to an embodiment, the substrate comprises a main surface comprising spatial dimensions smaller than or equal to the spatial dimensions of the surface of the passive component 1. According to an embodiment, the substrate is arranged directly on and above the surface of the passive component 1, in particular in such a way that one side edge of the substrate is situated directly above one side edge of the passive component 1.

According to an embodiment of the electronic module 10, the passive component 1 comprises a recess in the surface, the spatial dimensions of the recess corresponding to the spatial dimensions of the main surface of the semiconductor chip or to the spatial dimensions of the main surface of a substrate carrying the semiconductor chip. The semiconductor chip or the substrate carrying the semiconductor chip is inserted into the recess of the passive component 1. According to a further embodiment thereof, the passive component 1 comprises at least one electrical terminal, in particular an electrical terminal which is situated below the recess. In other words, the bottom of the recess is formed by the electrical terminal or at least a part of the electrical terminal. The electrical terminal can have a flat surface with a rectangular shape extending to an edge of the passive component 1.

According to an embodiment of the electronic module 10, the module comprises a second semiconductor chip, in particular in such a way that it is arranged on the before-mentioned substrate.

According to an embodiment of the electronic module 10, the first semiconductor chip comprises a transistor structure, in particular a vertical field-effect transistor structure or, alternatively, any other kind of field-effect transistor structure.

According to an embodiment of the electronic module 10, the first semiconductor chip and the second semiconductor chip both comprise power transistors, in particular vertical structured power MOSFETs. In particular these two power MOSFET transistors are part of a synchronous half-bridge buck converter circuit.

According to an embodiment of the electronic module 10, the module further comprises at least one capacitor, in particular an input capacitor and an output capacitor, which, for example, can be part of an electrical circuit such as a converter circuit, in particular a buck converter circuit.

According to an embodiment of the electronic module 10, the spatial dimensions of the module correspond to the spatial dimensions of the passive component 1. In case of an inductor as passive component 1, the main body of the inductor is formed of a ferrite material.

According to an embodiment of the electronic module 10, the module comprises or consists of one or more of a power supply module, a switch mode power supply module, a voltage regulator, a DC/DC converter, a buck converter, a boost converter, an LLC resonant converter, a TTF/ITTF converter, a phase-shifted ZVS converter, or an H4 converter.

The above-described embodiments make it possible to integrate two power devices, namely a high-side MOSFET and a low-side MOSFET of a voltage converter circuit and a passive component, in particular an inductor, into one single low-parasitic package. Thereby the high-side MOSFET and the low-side MOSFET are placed on or under the inductor bringing the board space consumption of active device virtually down to zero. Also significant efficiency improvements can be expected due to reduction of parasitic stray inductances and parasitic trace resistances. This allows increasing switching frequencies up to 1-2 MHz. A further advantage is that the passive component, in particular in case of an inductor, can be utilized as a heat-sink, since the active devices are mounted directly on or under the inductor and have a good thermal connection to the inductor itself. In general any large existing component resident in the vicinity of the power conversion structure can be considered as a potential host or substrate for the power devices. As mentioned above, this could also be a transformer, a shared heat-sink, a metal chassis of a keyboard, an electrolytic capacitor, or chassis or enclosure components.

Referring to FIG. 2, there is shown a schematic cross-sectional side view representation of a power supply module according to an embodiment. The power supply module 20 of FIG. 2 comprises an electronic circuit comprising at least one semiconductor chip 22 and at least one inductor 21, wherein the semiconductor chip 22 is arranged on a first surface of the inductor 21. The indicator 21 is represented here as a main body 21a which can be made of a ferrite material, and inductor windings 21b embedded within the main body 21a.

According to an embodiment of the power supply module 20, the inductor 21 comprises at least one electrical terminal on the first surface, wherein the semiconductor chip 22 is arranged on the at least one electrical terminal, the electrical terminal being connected with the inductor windings 21b. According to a further embodiment thereof, a contact pad of the semiconductor chip is directly electrically and mechanically connected with the at least one electrical terminal of the inductor 21 wherein a direct connection also includes connecting the chip to the terminal by means of glue or solders.

According to an embodiment of the power supply module 20, the spatial dimensions of the power supply module 20 correspond to the spatial dimensions of the inductor 21 which means that the spatial dimensions of the power supply module 20 are defined by the spatial dimensions of the inductor 21 as the biggest part of the power module 20. However, there might also be applications in which the power supply module is designed slightly larger than the inductor. For example, there may be passives or actives which are too large to be integrated under the inductor so that they would be outside of the footprint of the inductor so that in these cases the spatial dimensions of the power supply module are greater than the spatial dimensions of the inductor.

Further embodiments can be formed along the lines of the embodiments and features as described in connection with the electronic module 10 of FIG. 1.

In the above-described embodiment the at least one electrical terminal of the inductor may also act as a heat-pipe to pull heat generated in the semiconductor chip in a very efficient way into the inductor coil. The main body 21a of the inductor 21, which can be fabricated of a ferrite material, may act as a thermal mass for the whole assembly. It is also possible to artificially enlarge one or more of the outer surfaces of the main body 21a of the inductor by forming regular surface structures into it in order to conduct the generated heat in an efficient way to the outer atmosphere.

Referring to FIG. 3, there is shown a schematic cross-sectional representation of a power supply module according to an embodiment. The power supply module 30 of FIG. 3 comprises an electronic circuit comprising a first semiconductor chip 32 and at least one inductor 31, and a substrate 33, wherein the first semiconductor chip 32 is arranged on the substrate 33 and the substrate 33 is arranged on a surface of the inductor 31.

According to an embodiment of the power supply module 30, the substrate 33 is arranged in a recess of the inductor 31.

According to an embodiment of the power supply module 30, the electronic circuit comprises or consists of a voltage regulator circuit, a DC/DC converter circuit, a buck converter circuit, a boost converter circuit, an LLC resonant converter circuit, a TTF/ITTF converter circuit, a phase-shifted ZVS converter circuit, or an H4 converter circuit.

Further embodiments can be formed along the embodiments as described in connection with the electronic module of FIG. 1.

Figure 4:
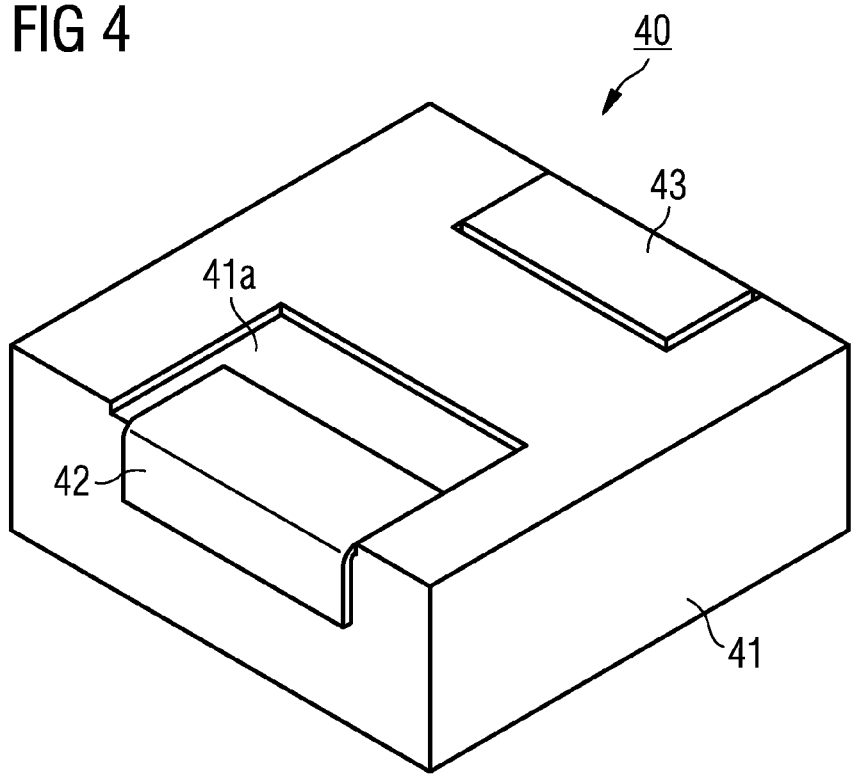
FIG. 4 shows a perspective representation of an inductor module according to an embodiment.

Referring to FIG. 4, there is shown a perspective view of an inductor module 40 according to an embodiment. The inductor module 40 of FIG. 4 can be utilized as a passive component of the embodiments previously described in connection with FIGS. 1-3.

The inductor module 40 comprises a main body 41 made of a ferrite material. It can be seen that in the upper main surface of the main body 41a plate-like rectangular recess 41a is formed having spatial dimensions so that a substrate of similar spatial dimensions can be inserted into it. The recess 41a extends to one of the side edges of the surface of the main body 41. This surface is normally designated as the bottom surface of the inductor module 40 as the module is normally mounted upside down with this surface onto a PCB board. At the bottom of the recess 41a a plate-like input connector 42 is attached to the surface of the main body 41 wherein at the edge of the surface the input connector 42 is bent downwards to a vertical plate-like portion of the input connector 42 attached to one of the side faces of the main body 41. The upper, horizontal plate-like portion of the input connector 42 is inserted into a further recess formed into the bottom face of the recess 41a so that a substrate can be inserted into the recess 41a in a way that the bottom surface of the substrate is in direct mechanical and electrical connection with the input connector 42. The inductor module 40 also comprises an output connector 43 which is attached to the main body 41 in almost the same way as the input connector 42, i.e., the output connector 43 comprising a flat horizontal portion inserted in a recess formed in the upper surface of the main body 41 and a vertical portion (not shown) attached to another side face of the main body 41 and connected with the horizontal portion of the output connector 43 by a bent-down portion.

The inductor module 40 of FIG. 4 can be a simple, low inductance type which contains a flat copper strip (not shown) that passes through the center of the ferrite main body 41. Other inductor modules, such as those schematically shown in FIG. 2, have larger inductance values and contain a true copper coil.

Referring to FIG. 5, there is shown a perspective view of a power supply module according to an embodiment. The power supply module 50, as shown in FIG. 5, is fabricated by providing an inductor module 52, such as that shown as inductor module 40 in FIG. 4, and inserting a substrate 51 into a recess 52a formed into the surface of a main body of the inductor 52. The substrate 51 comprises a high-side MOSFET transistor 51.1 (Vin) and a low-side MOSFET transistor 51.2 (Gnd) wherein the pair of MOSFET transistors is connected in a synchronous buck converter configuration. The MOSFET transistors 51.1 and 51.2 are configured to have direct vertical connection to the input connector 52.1 of the inductor 52. In this configuration the current passes vertically directly through the semiconductor die. The power supply module 50 also comprises an output connector 52.2 of the inductor 52. The output connector 52.2 is formed in a similar way as the input connector 52.1. The upper horizontal portion of the output connector 52.2 is located in a recess on the upper surface of the inductor 52 and a vertical portion of the output connector 52.2 (not shown) is formed and attached to the inductor 52 in the same way as the vertical portion of the input connector 52.1.

The power supply module 50 as shown in FIG. 5 will be mounted with its upper surface to a PCB so that in a mounted state on a PCB the converter circuit with the semiconductor chips is situated completely under the inductor.

Referring to FIGS. 6a and 6b, there are shown perspective top and bottom views of a substrate 60 such as that shown and designated with reference sign 51 in FIG. 5. The material of the substrate 60 may be a plastic material such as a high thermally resistant semi-rigid or rigid material such as polyimide, peek, high TG epoxy resin or bismaleimide, more specifically bismaleimide-triazine BT laminate, glass reinforced epoxy resin, PTFE, carbon and/or Kevlar reinforced resins, polyester material and so on. The substrate thickness may be in the range from about 25 µm to about 1 mm, or may be in the range from about 25 µm to about 250 µm, or may be in the range from about 20 µm to about 100 µm. The substrate 60 as shown in FIGS. 6a and 6b has the input and signal connections all on one side of the substrate 60, namely on the upper surface 60.1 shown in FIG. 6a, whereas on the bottom surface 60.2 shown in FIG. 6b is the output, which is connected directly to the inductor connector. The substrate 60 comprises a first, high-side MOSFET transistor 61 (Vin) and a second, low-side MOSFET transistor 62 (Gnd). On the bottom surface 60.2 of the substrate 60 an electrical contact area 63 (L-out) is provided which is supposed to be connected directly mechanically and electrically with the inductor connector. In a synchronous buck converter the two switches, namely the two semiconductor transistors, are both connected with one of their respective terminals with the inductor. In the embodiment of FIGS. 6a and 6b the vertical transistor chips 61 and 62 are both electrically connected with their back surface electrical terminals by the through-connections of the substrate 60 with the contact area 63. The substrate 60 can be connected with its back surface 60.2 to the inductor using solder and glue or underfill. Also possible is to use a conductive polymer in combination with a non-conductive polymer.

The substrate 60 may comprise additional semiconductor chips like, for example, a semiconductor chip containing a driver circuit for driving the converter circuit. In this case, the module would be a complete power supply module. The substrate 60 may comprise at least additional contact pads for connecting the module with external circuits like a driver circuit. Also the capacitor or capacitors, resistors, discrete diodes etc. of the converter circuit could in principle be also integrated on the substrate 60.

Referring to FIG. 7, there is shown a perspective view of a power supply module according to an embodiment. The power supply module 70 of FIG. 7 is also formed on the basis of an inductor module such as the inductor module 50 as shown in FIG. 5. The power supply module 70 of FIG. 7 comprises a substrate 71 which has a plate-like rectangular or quadratic form having two main surfaces having spatial dimensions corresponding to the spatial dimensions of the upper surface of the inductor 72. The inductor 72 corresponds in principle to inductor 40 of FIG. 4 but does not have a recess 41a formed in the upper surface. Instead the upper surface of the inductor 72 is plane so that the substrate 71 can be attached to it by using solder and glue or underfill or a conductive polymer in combination with a non-conductive polymer. The inductor 72 comprises a main body 72.1 made of a ferrite material, an input connector 72.2 and an output connector (not shown). The input connector and the output connector can have the same form and shape as those in FIGS. 4 and 5, whereas both the input connector 72.2 and the output connector are arranged on the upper surface of the inductor 72 in the same way as the output connector 43 of the inductor module 40 shown in FIG. 4, i.e., formed in a recess on the upper surface of the inductor so that the upper surface is plane. The substrate 71 has in principle the same structure as the substrate 51 of the power supply module 50 of FIG. 5. Furthermore, the substrate 71 comprises a first, high-side MOSFET transistor 71.1 and a second low-side MOSFET transistor 71.2. The substrate 71 further comprises an output connector 71.3 which is connected with the output connector of the inductor 72 by a through-connection through the substrate. The substrate 71 further comprises additional external IC connection 71.4 which could be used for a driver IC, a controller/driver IC and/or for sense functions. The power supply module 70 of FIG. 7 is more complete than the power supply module 50 of FIG. 5 as the substrate 71 covering the entire surface of the inductor 72 allows the completion of the converter circuit. It is also possible to integrate a controller and/or driver on the substrate 71 which would yield a complete power supply module or a complete phase of a multi-phase power supply module.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. An electronic module comprising:
a passive component having an upper surface of a first area; and
a first semiconductor chip having a lower surface of a second area that is smaller than the first area, wherein the lower surface of the first semiconductor chip is arranged on the upper surface of the passive component, wherein the first semiconductor chip is electrically and mechanically attached to the passive component, and wherein the first semiconductor chip comprises a vertical field-effect transistor.

2. The electronic module according to claim 1, wherein the passive component comprises one or more of an inductor, a capacitor, a transformer, a heatsink, or a chassis component or enclosure component.

3. The electronic module according to claim 1, wherein the passive component comprises at least one electrical terminal, and wherein the first semiconductor chip is arranged on the at least one electrical terminal.

4. The electronic module according to claim 3, wherein a contact pad of the first semiconductor chip is directly electrically and mechanically connected with the at least one electrical terminal.

5. The electronic module according to claim 1, wherein the electronic module comprises an electronic circuit, the first semiconductor chip and the passive component being part of the electronic circuit.

6. The electronic module according to claim 1, further comprising a substrate arranged on the upper surface of the passive component, the first semiconductor chip being arranged on the substrate.

7. The electronic module according to claim 6, wherein the substrate comprises a first surface and a second surface and a plurality of through-holes extending from the first surface to the second surface.

8. The electronic module according to claim 6, wherein the substrate comprises a main surface having an area smaller than or equal to the area of the upper surface of the passive component.

9. The electronic module according to claim 1, wherein the passive component comprises a recess in the surface, spatial dimensions of the recess corresponding to spatial dimensions of the first semiconductor chip or to spatial dimensions of a substrate carrying the first semiconductor chip.

10. The electronic module according to claim 9, wherein the passive component comprises at least one electrical terminal situated below the recess.

11. The electronic module according to claim 6, further comprising a second semiconductor chip arranged on the substrate.

12. The electronic module according to claim 11, wherein the first semiconductor chip is arranged on a first surface of the substrate, and wherein the second semiconductor chip is arranged on a second surface of the substrate, the second surface situated opposite to the first surface.

13. The electronic module according to claim 1, further comprising at least one capacitor electrically coupled to the first semiconductor chip or the passive component.

14. The electronic module according to claim 13, wherein the at least one capacitor comprises an input capacitor and an output capacitor.

15. The electronic module according to claim 1, wherein spatial dimensions of the electronic module correspond to spatial dimensions of the passive component or are greater than the spatial dimensions of the passive component.

16. The electronic module according to claim 1, wherein the electronic module comprises one or more of a power supply module, a switch-mode power supply module, a voltage regulator, a DC/DC converter, a buck converter, a boost converter, an LLC resonant converter, a TTF/ITTF converter, a phase-shifted ZVS converter, or an H4 converter.

17. An electronic module comprising:
    a passive component having an upper surface of a first area;
    a first semiconductor chip having a lower surface of a second area that is smaller than the first area, wherein the lower surface of the first semiconductor chip is arranged on the upper surface of the passive component, and wherein the first semiconductor chip is electrically and mechanically attached to the passive component; and
    at least one capacitor electrically coupled to the first semiconductor chip or the passive component, wherein the at least one capacitor comprises an input capacitor and an output capacitor.

18. The electronic module according to claim 17, wherein the passive component comprises at least one electrical terminal, wherein the first semiconductor chip is arranged on the at least one electrical terminal, wherein a contact pad of the first semiconductor chip is directly electrically and mechanically connected with the at least one electrical terminal.

19. The electronic module according to claim 17, wherein the passive component comprises a recess in the surface, spatial dimensions of the recess corresponding to spatial dimensions of the first semiconductor chip or to spatial dimensions of a substrate carrying the first semiconductor chip, and wherein the passive component comprises at least one electrical terminal situated below the recess.

20. The electronic module according to claim 17, further comprising a second semiconductor chip arranged on a substrate, wherein the first semiconductor chip is arranged on a first surface of the substrate, and wherein the second semiconductor chip is arranged on a second surface of the substrate, the second surface situated opposite to the first surface.

21. The electronic module according to claim 17, wherein the electronic module comprises one or more of a power supply module, a switch-mode power supply module, a voltage regulator, a DC/DC converter, a buck converter, a boost converter, an LLC resonant converter, a TTF/ITTF converter, a phase-shifted ZVS converter, or an H4 converter.

22. The electronic module according to claim 17, further comprising a substrate arranged on the upper surface of the passive component, the first semiconductor chip being arranged on the substrate, wherein the substrate comprises a first surface and a second surface and a plurality of through-holes extending from the first surface to the second surface.

23. The electronic module according to claim 17, further comprising a substrate arranged on the upper surface of the passive component, the first semiconductor chip being arranged on the substrate, wherein the substrate comprises a main surface having an area smaller than or equal to the area of the upper surface of the passive component.

24. An electronic module comprising:
    a passive component having an upper surface of a first area; and
    a semiconductor chip having a lower surface of a second area that is smaller than the first area, wherein the lower surface of the semiconductor chip is arranged on the upper surface of the passive component, wherein the semiconductor chip is electrically and mechanically attached to the passive component,
    wherein the passive component comprises a recess in the surface, spatial dimensions of the recess corresponding to spatial dimensions of the semiconductor chip or to spatial dimensions of a substrate carrying the semiconductor chip, and
    wherein the passive component comprises at least one electrical terminal situated below the recess.

* * * * *